(12) United States Patent
Huang et al.

(10) Patent No.: US 10,621,383 B2
(45) Date of Patent: Apr. 14, 2020

(54) DETECTION AND ELIMINATION OF STRESS SINGULARITY

(71) Applicant: Dassault Systemes SolidWorks Corporation, Waltham, MA (US)

(72) Inventors: Li-Ling Huang, West Covina, CA (US); Prasad Nimmagadda, North Providence, RI (US); Subbi Reddy Chirla, Pune (IN); Nandish Datti, Pune (IN)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 370 days.

(21) Appl. No.: 15/625,707

(22) Filed: Jun. 16, 2017

(65) Prior Publication Data

US 2017/0364608 A1    Dec. 21, 2017

Related U.S. Application Data

(60) Provisional application No. 62/351,751, filed on Jun. 17, 2016.

(51) Int. Cl.
G06F 17/50    (2006.01)
G06F 30/00    (2020.01)
G06F 30/23    (2020.01)

(52) U.S. Cl.
CPC .............. *G06F 30/00* (2020.01); *G06F 30/23* (2020.01)

(58) Field of Classification Search
CPC ................................. G06F 17/50; G06F 30/23
USPC .......................................................... 703/1
See application file for complete search history.

(56) References Cited

U.S. PATENT DOCUMENTS

| | | | |
|---|---|---|---|
| 2001/0040997 A1* | 11/2001 | Tsap | G06T 7/0012 382/154 |
| 2003/0098139 A1* | 5/2003 | Roche | B22D 23/003 164/46 |
| 2010/0274537 A1 | 10/2010 | Le et al. | |

OTHER PUBLICATIONS

Xu et al. (Finite Element Analysis of Stress Singularities in Attached Flip Chip Packages, (6 pages)). (Year: 2014).*
Notification Concerning Trasmittal of International Preliminary Report on Patentability for Int'l Application No. PCT/US2017/037951, titled: Detection and Elimination of Stress Singularity, dated Dec. 27, 2018.
International Search Report and Written Opinion for Int'l Application No. PCT/US2017/037951, titled: Detection and Elimination of Stress Singularity, dated Sep. 5, 2017.

(Continued)

*Primary Examiner* — Andre Pierre Louis
(74) *Attorney, Agent, or Firm* — Hamilton, Brook, Smith & Reynolds, P.C.

(57) ABSTRACT

A computer-implemented method and system automatically detects stress singularity in a three-dimensional (3D) computer-aided design (CAD) model. A potential area of high stress is detected. A finite element mesh of the 3D CAD model is refined, at least in the potential area of high stress, after which, whether the high stress value converges is determined. A user is alerted that the potential area of high stress is an area having one or more elements of stress singularity. Suggestions are made regarding how to eliminate the stress singularity and the user is enabled to modify the design of the 3D CAD model to eliminate the stress singularity.

24 Claims, 10 Drawing Sheets
(8 of 10 Drawing Sheet(s) Filed in Color)

| REGION DETECTED | STRESS CONCENTRATION | REFINE 1 | REFINE 2 |
|---|---|---|---|
| PART1, EDGE2 | ☑ | ☑ | |
| PART1, EDGE2 / LOAD1 | ☑ | ☑ | ☑ |
| PART3, EDGE1 | ☑ | ☑ | ☑ |
| PART3, VERTEX1 | ☑ | ☑ | ☑ |

| REFINE 2 REGIONS | SELECT TO ADJUST | | FILLET RADIUS | FILLET PROPERTIES | LOAD PROPERTIES |
|---|---|---|---|---|---|
| PART2, EDGE2 / LOAD1 | ☑ | | 2.1 mm | 🔲 | ⬇ |
| PART3, EDGE1 | ☑ | | 1.3 mm | 🔲 | |
| PART3, VERTEX1 | ☐ | | 0 mm | 🔲 | |
| | Run | | | | |

(56) References Cited

OTHER PUBLICATIONS

Weib, A. "Stress Singularities | Andy's Log," Dec. 14, 2010 (Dec. 14, 2010), pp. 1-21, XP055400221, Retrieved from the Internet: URL: https://andreweib.wordpress.com/2010/12/14/stress-singularities/ [retrieved on Feb. 21, 2018].
Autodesk Fusion 360: "Quick Tip: What are Singularities?" Youtube, Dec. 7, 2015 (Dec. 7, 2015), XP054977658, Retrieved from the Internet: URL: https://www.youtube.comjwatch?v=nkB7dWReYxM [retrieved on Aug. 23, 2017].
Acin, M. "Stress singularities, stress concentrations and mesh convergence—Acin.Net" Jun. 2, 2015 (Jun. 2, 2015), pp. 1-15, XP055400009, Retrieved from the Internet: URL: http://www.acin.net/2015/06/02/stressingularities-stress-concentrations-and-mesh-convergence/ [retrieved on Aug. 21, 2017].
Sinclair, G.B., "Stress singularities in classical elasticity—I: Removal, interpretation, and analysis," Applied Mechanics Reviews, vol. 57, No. 4, Jun. 2004 (Jun. 2004), pp. 251-297, XP055400190, US.
Magnin, A., "Autodesk Fusion 360: Quick Tip: Singularities and Simulation," retrieved from the Internet: https://www.autodesk.com/products/fusion-360/blog/quick-tip-singularities-and-simulation/ retrieved on Feb. 21, 2018.

\* cited by examiner

FIG. 5A

| REGION DETECTED | STRESS CONCENTRATION | REFINE 1 | REFINE 2 |
|---|---|---|---|
| PART1, EDGE2 | ☑ | ☑ | |
| PART1, EDGE2 / LOAD1 | ☑ | ☑ | ☑ |
| PART3, EDGE1 | ☑ | ☑ | ☑ |
| PART3, VERTEX1 | ☑ | ☑ | ☑ |

FIG. 5B

| REFINE 2 REGIONS | SELECT TO ADJUST | | FILLET RADIUS | FILLET PROPERTIES | LOAD PROPERTIES |
|---|---|---|---|---|---|
| PART2, EDGE2 / LOAD1 | ☑ | ⊥ | 2.1 mm | ▣ | ⤓ |
| PART3, EDGE1 | ☑ | ⊥ | 1.3 mm | ▣ | |
| PART3, VERTEX1 | ☐ | ⊥ | 0 mm | ▣ | |
| Run | | | | | |

DETECTION AND ELIMINATION OF STRESS SINGULARITY

RELATED APPLICATION(S)

This application claims the benefit of U.S. Provisional Application No. 62/351,751, filed on Jun. 17, 2016. The entire teachings of the above application(s) are incorporated herein by reference.

BACKGROUND OF THE INVENTION

Computer-aided design (CAD) software allows a user to construct and manipulate complex three-dimensional (3D) models. A number of different modeling techniques can be used to create a 3D model. One such technique is a solid modeling technique, which provides for topological 3D models where the topological entities have corresponding supporting geometrical entities.

A design engineer designs physical and aesthetic aspects of 3D models, and is skilled in 3D modeling techniques. The design engineer creates parts and may assemble the parts into a subassembly or an assembly. A subassembly may also consist of other subassemblies. An assembly is designed using parts and subassemblies. Parts and subassemblies are hereinafter collectively referred to as components.

During the design process and once a 3D model is constructed, an engineer may simulate the design of a model to analyze and evaluate the real-world performance of the product being designed. Such a simulation may be executed by an engineering simulation application. An example of such an application is SOLIDWORKS® Simulation available from Dassault Systemes SolidWorks Corporation of Waltham, Mass., which uses the CAD model data to set up and execute simulation studies. Simulation may include finite element analysis (FEA) techniques. FEA can help determine strains and stresses under internal and external loads with respect to a 3D design of a product for manufacture.

FEA processes sub-divide a 3D model into distinctive elements, thereby creating a mesh with the goal of reducing the difficulty of a problem. Generally understood is that the more a mesh is refined, the more accurate are the results. This is the basic concept of "adaptive meshing" technology, which is a well-known, automatic approach in FEA to refine a mesh in a high stress area.

Stress singularity, however, is a common difficulty in such convergence practice. Stress singularity occurs when numerical errors increase with smaller mesh elements. In other words, no matter how the mesh is refined, the stress does not converge to the true solution. On the contrary, the stress diverges. Although this artificial high stress caused by the mathematical approach is well-known among simulation FEA analysts (many who earned a Ph.D. in Mechanical Engineering or related fields), CAD system users with less knowledge of FEA are often puzzled with regard to which result is accurate and whether the simulation result may be trusted. CAD system vendors may need to employ technical support personnel with an advanced education and knowledge in FEA to respond to customer queries. Moreover, often after receiving a response, a user may ask how to eliminate stress singularity to help validate a design.

The present invention assists a user who is not an expert in FEA by providing a tool to identify stress singularity and other common FEA difficulties (e.g., such as material, mesh, and stress concentration). Moreover, the present invention provides guidance to the user in overcoming these difficulties. Time-saving advantages and enhancements to current CAD systems are achieved by providing more efficient means for identifying and dealing with stress singularity.

SUMMARY OF THE INVENTION

In general, in one aspect, embodiments of the invention feature a computer-implemented method of automatically detecting a potential area of high stress in which an element having a high stress value in the potential area has surrounding elements with a rapid change of stress gradient. The invention refines a finite element mesh of the 3D CAD model in at least the potential area of high stress and determines whether the high stress value converges. The user is alerted to the potential area of high stress in an area having one or more elements of stress singularity and a suggestion is made to the user with regards to how to eliminate the stress singularity. The user can modify the design of the 3D CAD model to eliminate the stress singularity.

Other embodiments include a computer-aided design (CAD) system having a processor operatively coupled to a data storage system and a data storage memory operatively coupled to the processor. In such embodiments, the data storage system stores a three-dimensional model, and the data storage memory comprises instructions to configure the processor to detect a potential area of high stress in which an element having a high stress value in the potential area has surrounding elements with a rapid change of stress value, refine a finite element mesh of the 3D CAD model in at least the potential area of high stress, and determine that after the refining step the high stress value does not converge. Instructions also configure the processor to alert a user that the potential area of high stress is an area having one or more elements of stress singularity, suggest to the user how to eliminate the stress singularity, and enable the user to modify the design of the 3D CAD model to eliminate the stress singularity.

Yet other embodiments include a computer-readable data storage medium containing instructions for detecting a potential area of high stress in which an element having a high stress value in the potential area has surrounding elements with a rapid change of stress value. A finite element mesh of the 3D model is refined, at least the potential area of high stress. After the refining the mesh, whether the high stress value has converged is determined. A user is alerted to the potential area of high stress is an area having one or more elements of stress singularity. A suggestion is made to the user with regards to how to eliminate the stress singularity and the user is enabled to modify the design of the 3D CAD model to eliminate the stress singularity.

To detect the potential area of high stress, aspects of the invention narrow an analysis of finite elements to those finite elements having higher strain values than other ones of the finite elements and/or analyze a local area of a part in the 3D CAD model. Other aspects of the invention include analyzing the 3D model to locate geometry forming sharp angles, visually indicating the area of stress singularity, and suggesting to the user removing sharp angled geometry, creating a new geometric entity, and changing a load to eliminate stress singularity. Suggesting to the user may take the form of one or both of a tool tip and a table. Moreover, an embodiment of the invention may integrate a finite element analysis process and a computer-aided design system, and automatically change the underlying 3D CAD model upon the user choosing a suggestion of how to eliminate the stress singularity.

The details of one or more embodiments of the invention are set forth in the accompanying drawings and the description that follows. Other features, objects, and advantages of the invention will be apparent from the description and drawings, and from the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 5a is an illustration of a table to inform a user of stress concentration and stress singularity regions.

FIG. 5b is an illustration of a user interface used to help eliminate stress singularity.

DETAILED DESCRIPTION OF THE INVENTION

The present invention automatically detects and identifies stress singularity and other common finite element analysis (FEA) difficulties, such as material, mesh, and stress concentration. After detecting one or more areas where stress is locally high, the present invention suggests and automatically adjusts a 3D model and simulation setup to eliminate stress singularity. Moreover, the inventive concepts described herein provide a self-learning process to extend a user's knowledge and experiences.

Figure 1A:
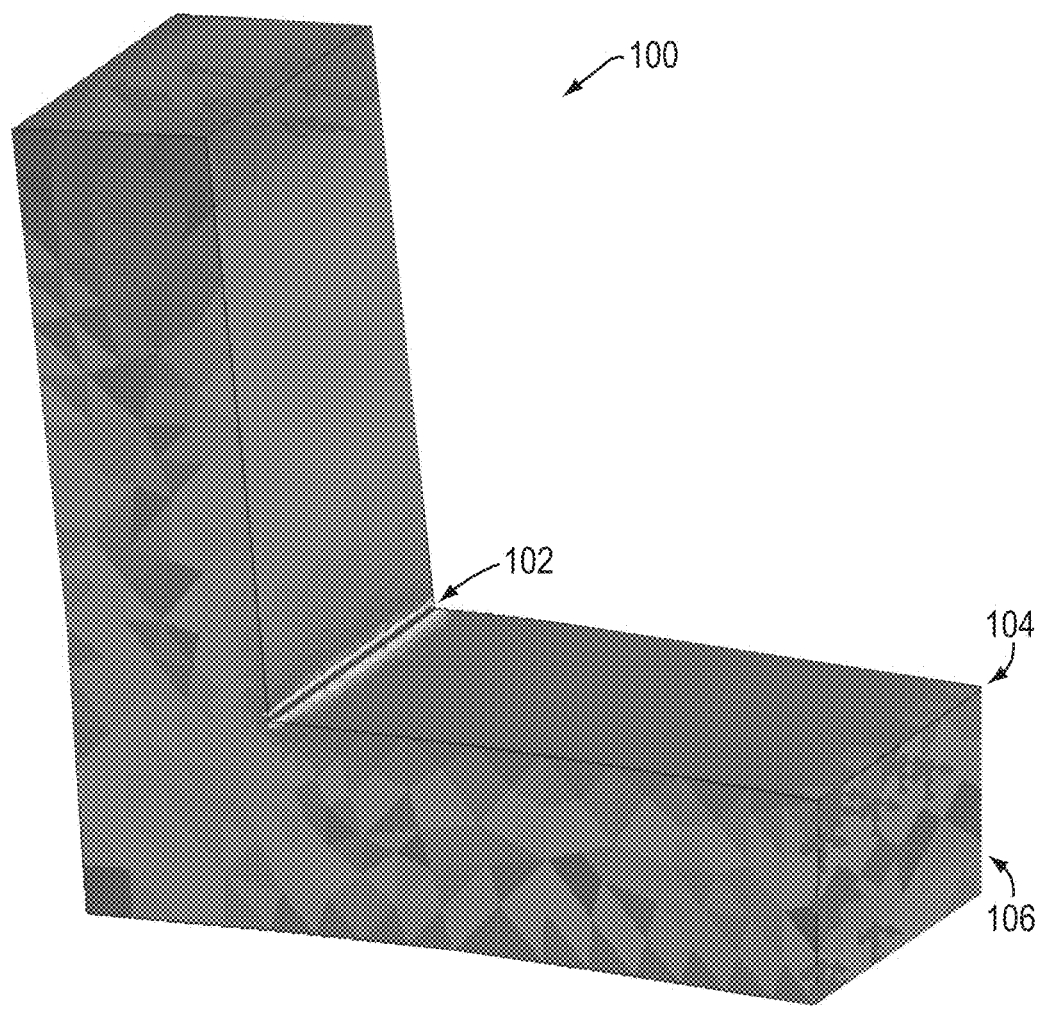
FIG. 1a is an illustration of a computer-aided design (CAD) model and stress singularity.
Figure 1B:
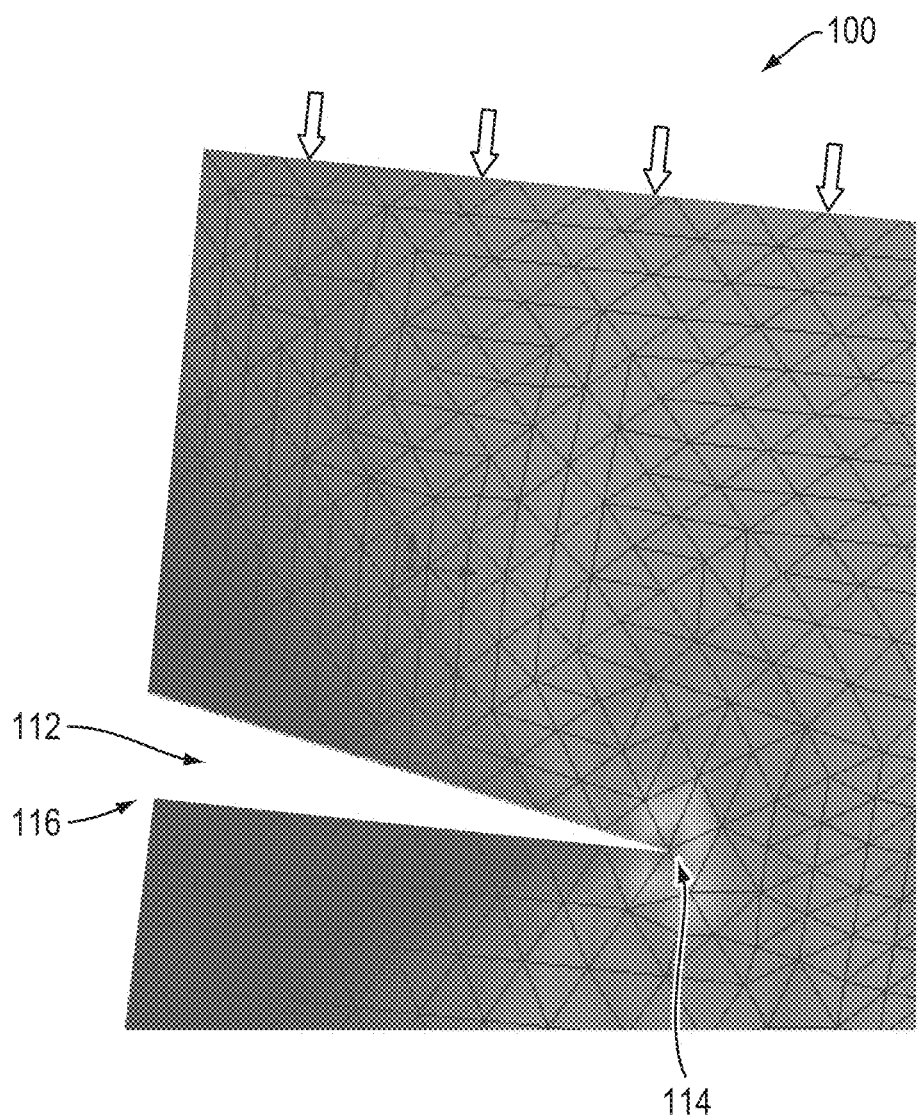
FIG. 1b is an illustration of a CAD model and stress singularity.
Figure 1C:
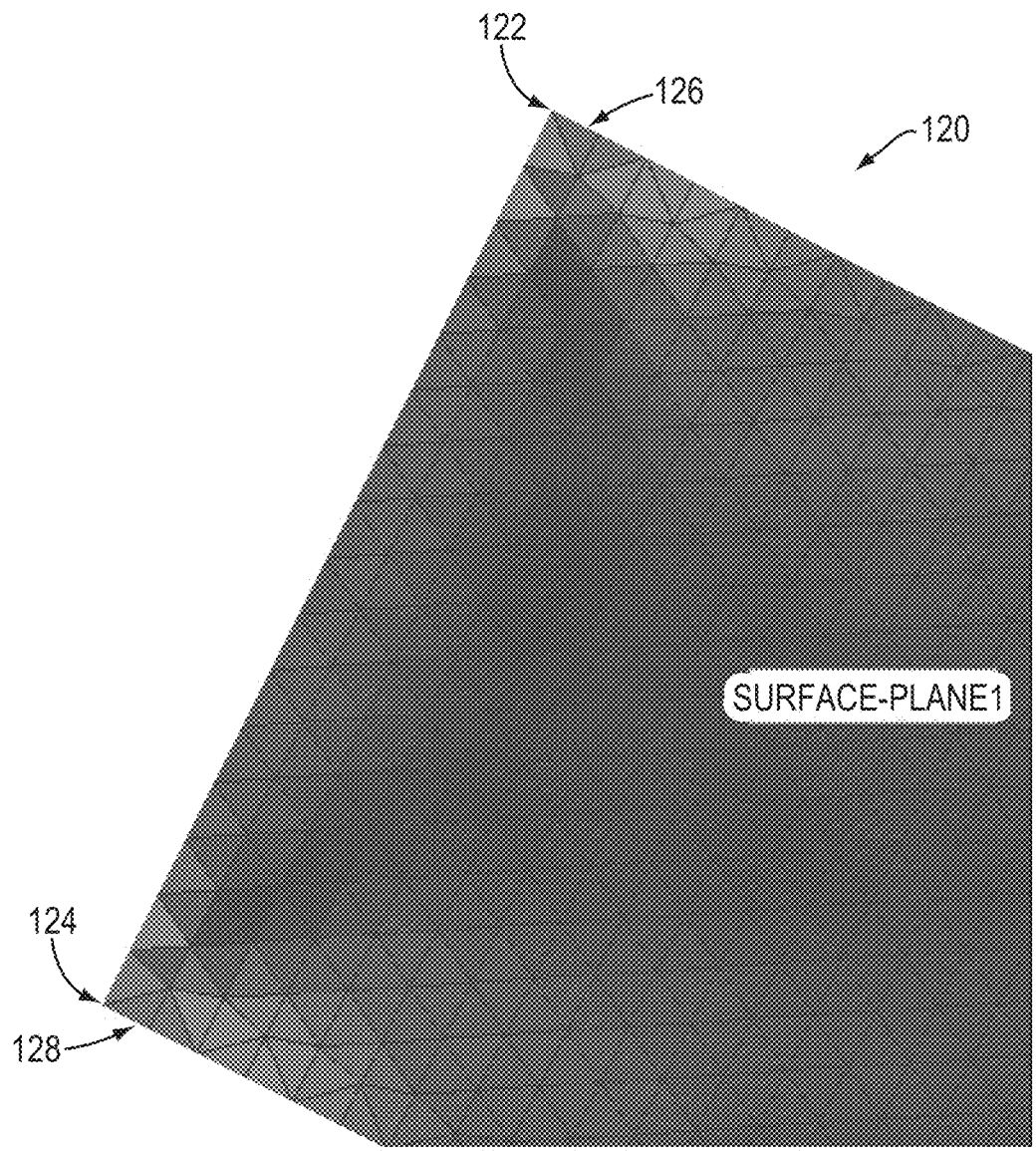
FIG. 1c is an illustration of a CAD model and stress singularity.

Referring now to FIGS. 1a, 1b, and 1c, certain causes of stress singularity are illustrated, by way of non-limiting example. FIG. 1a shows a 3D model 100 having a sharp corner 102 that causes stress singularity, which is indicated by the yellow and red coloring of the sharp corner 102. Areas of non-sharp corners and edges (e.g., non-sharp corner 104 and non-sharp edge 106) are indicated in a green or blue.

In FIG. 1b, a 3D model 110 contains a sharp cut 112. The sharp cut 112 causes stress singularity in the area of the mesh colored in red 114; whereas, the non-sharp corner 116 does not cause stress singularity and is colored blue. From the non-sharp corner to the area of the mesh colored in red 114, a gradual change in stress is occurring as indicated by the way in which the elements are colored from green to blue to red.

Referring now to FIG. 1c, an illustration is shown of a 3D model 120 having stress singularities caused by point loads 122, 124. Again, the areas of stress singularity 126, 128 are indicated in red. Apparent in FIG. 1c is a dramatic change from blue to red elements illustrated by a vertex of a red element and a vertex of a blue element share the same point.

Figure 1D:
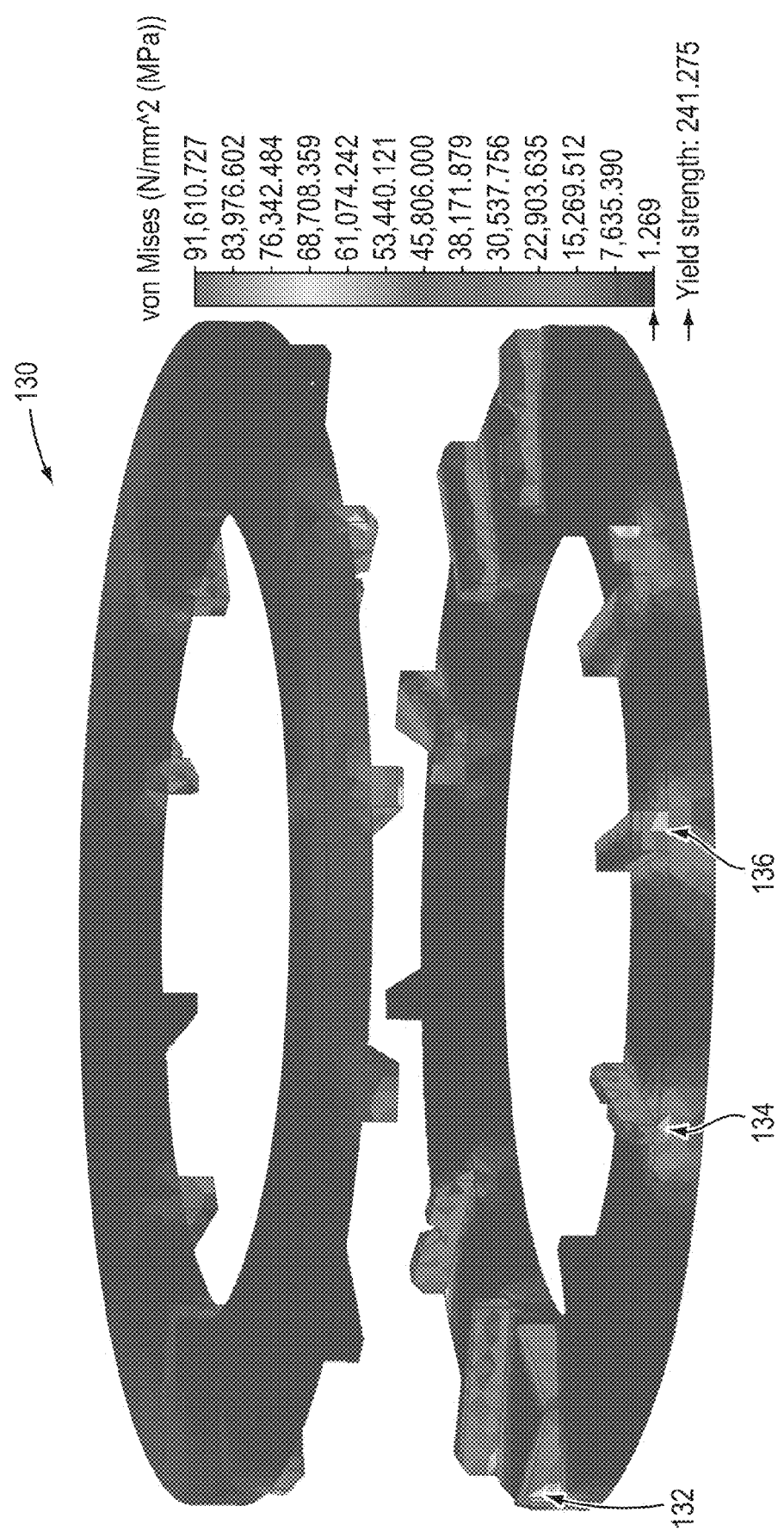
FIG. 1d is an illustration of a CAD model and stress singularity.

FIG. 1d illustrates stress in isolated local areas 132, 134, 136 of a 3D model 130. Local areas 132, 134, 136 do not appear to be areas of high stress in a global sense, that is, when considering the 3D model 130 as a whole and the overall coloring thereof with regards to the von Mises color spectrum.

Figure 2:
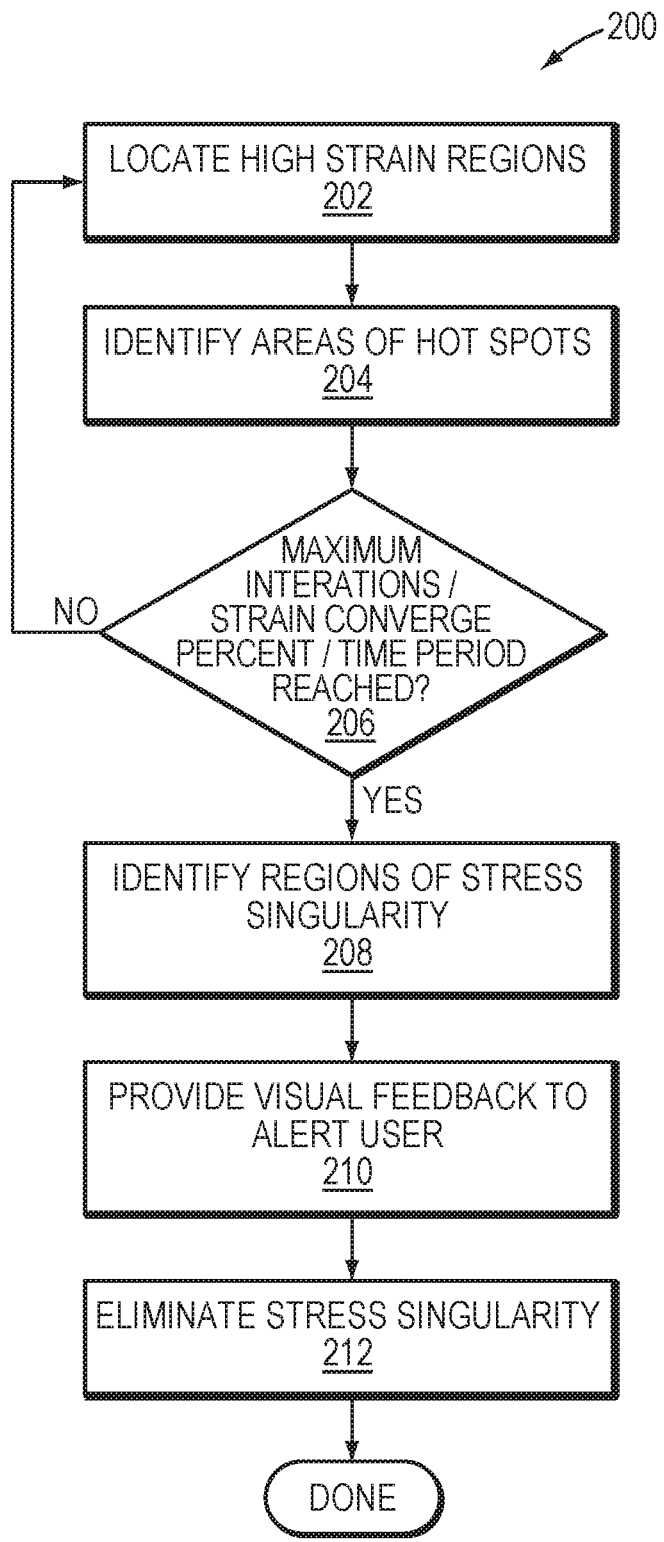
FIG. 2 is a flow diagram containing steps to detect and eliminate stress singularity.

Referring now to FIG. 2 illustrating one embodiment of the present invention, a process 200 that detects and eliminates stress is shown. In the first step, high strain regions are located (step 202). In general, stress singularity occurs in a high strain region. To locate these regions, each element is analyzed to determine whether the respective element is singular (i.e., when a mesh is refined, the stress value for that respective element grows and does not converge). Generally for the singular elements, the strain value will be on the higher side of the strain values for the whole model. However, multiple regions of singularities may exist and the strains may be locally high but low compared with the global highest value.

The present invention allows the user to narrow the search for high strain regions of an individual solid or surface body. This way multiple singularities on multiple bodies can be identified. To narrow the search, and thus reduce the amount of processing required, the user may specify a percentage of the highest strain value (i.e., peak strain) to consider. For example, if the local highest strain value was 0.80 and the user wishes process 200 to only consider the elements having the highest 30% of strain values, only finite elements having a strain value of 0.56 and above are considered. Then, the von Mises value of the specified finite elements is calculated for all finite elements in the mesh.

In the next step, areas of stress hot spots are identified (step 204). Stress hot spots are high stress regions in a model that may contain both stress singularities and stress concentrations. A stress hot spot is determined by finding the local stress peak, and finding regions with sharp angled geometry and rapid changes of stress gradient. Areas of stress concentration may be visually apparent due to a bad mesh, stress singularity colorfully visible (as shown in FIGS. 1a-1d), or both.

After calculating the Von Mises stress values for each element, the elements that lie in areas susceptible to stress singularity (e.g., sharp edges, cuts, and corners) are identified as stress hot spots. High stress concentration elements that are attached to the singularities may also be identified as stress hot spots. First, finite elements that lie on the edges of a solid or surface body are located based on the geometry of the solid or surface body. Next, the angles between two adjacent faces of each of these edges are determined. If an angle between two adjacent faces is less than a specified value, the corner resulting from those two faces is considered sharp; otherwise the corner is considered not sharp. In an embodiment, the value of an angle that determines sharpness defaults to 90° and less, and may be modified by the user. Identifying elements that lie in areas susceptible to stress singularity is possible due to the integration of a simulation process with a CAD system and is based on the mesh created by the simulation process and the CAD features created by the CAD system. By way of non-limiting example, a mesh area may not be considered susceptible to stress singularity if a fillet or a circular face is present in that mesh area.

Next, the elements having high-stress gradients are identified. A stress gradient is the rate of change of stress from one finite element to the next and over a series of elements. Given the areas susceptible to stress singularity (located in step 202), an element in that area is selected and two rings of elements that surround the selected element are identified.

Figure 3:
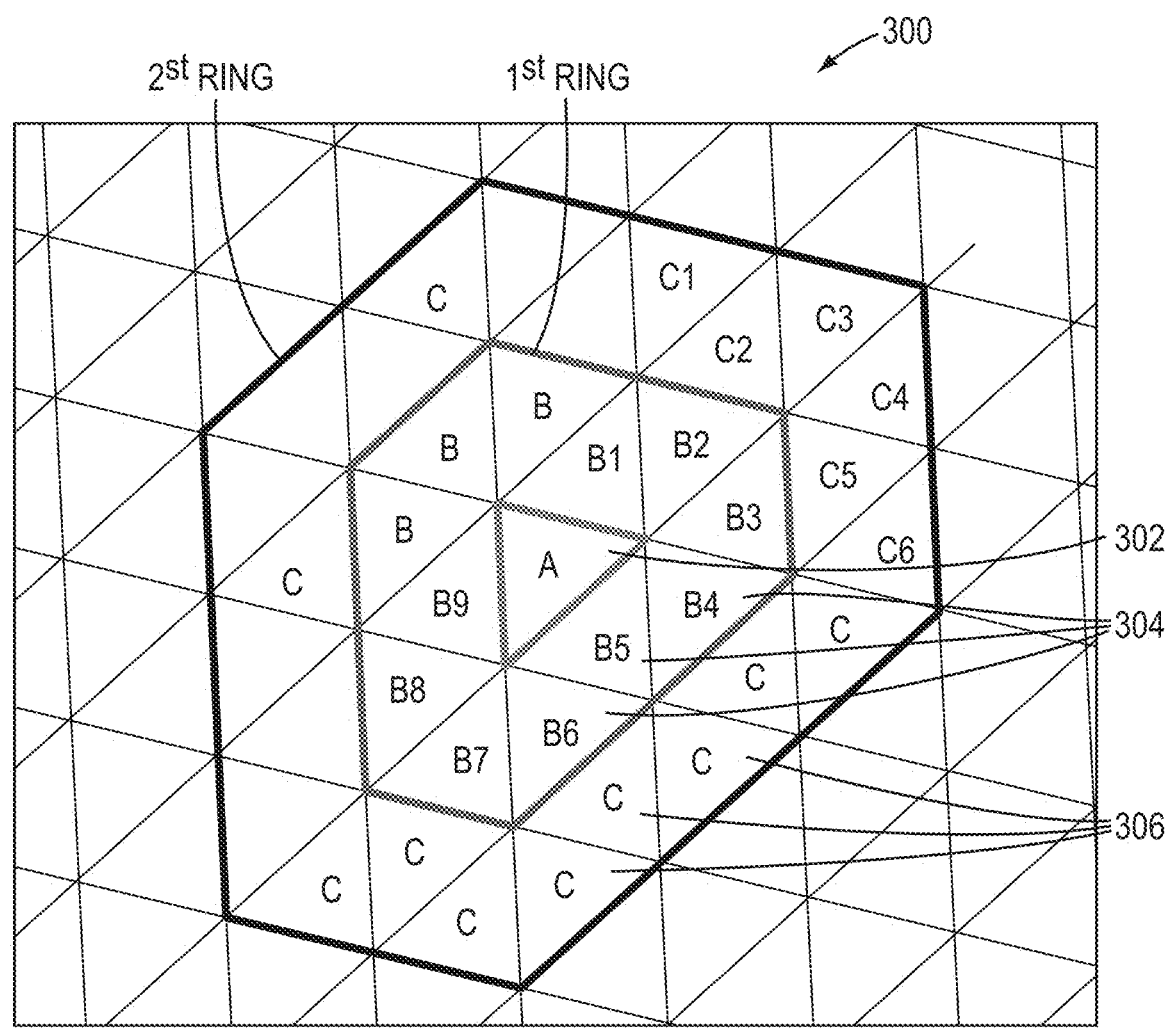
FIG. 3 is an illustration of an area susceptible to stress singularity.

Referring now to FIG. 3, an area susceptible to stress singularity 300 is illustrated. An element A 302 is surrounded by a first ring of elements having labels beginning "B" (e.g., B4, B5, and B6 elements 304). The first ring of elements is surrounded by a second ring of elements beginning with the letter "C" (e.g., C elements 306). A first and second stress ratio used to approximate the stress gradient is calculated as follows:

Stress Ratio $G1$=Stress at $A$/Stress at $B$

Stress Ratio $G2$=Stress at $B$/Stress at $C$

Element A 302 is considered singular if:
$G1/G2>X$, where X is greater than 1.0 and is an indicator of the stress intensification as region A is approached; a typical value of X ranges from 1.1 to 2.0.
In an embodiment, the value of X is set to 1.30, which the user may change. If the condition $G1/G2>X$ satisfies for the elements in element A and rings B, and C, A is considered a stress hot spot.

Referring back to FIG. 2, the next step identifies regions of stress singularity (step 206). This step refines the mesh at least in the areas of stress hot spots. For example, given a stress hot spot, process 200 detects problematic edges). Then, repeated are the steps to locate the high stress regions (step 202) and identify areas of stress hot spots (step 204). These steps may be repeated up to a maximum number of iterations (tested in step 206), and for each iteration, the results of the current and previous iterations are compared. If the regions still diverge, these are regions of stress singularity. The criteria for this iteration cycle of process 200 to end (step 206) is set to a maximum strain converged within some percentage, combined with maximum number of iterations, and/or execution time. The criteria may be set by default or by a user's preference, determined by way of non-limiting example by the length of time to complete the iteration cycle.

After the iteration cycle, the highest von Mises stresses of problematic entities (e.g., problematic edge and vertex entities) that are in a hot spot are stored. Using this information, the stress variation across all the iterations along all the problematic entities are evaluated. Based on the divergent or convergent nature of stresses, process 200 confirms the existence of stress singularities for each problematic entity. If the elements belonging to any of the problematic entities show stress converging behavior after all iterations these elements are treated as high stress concentration areas.

Figure 4A:
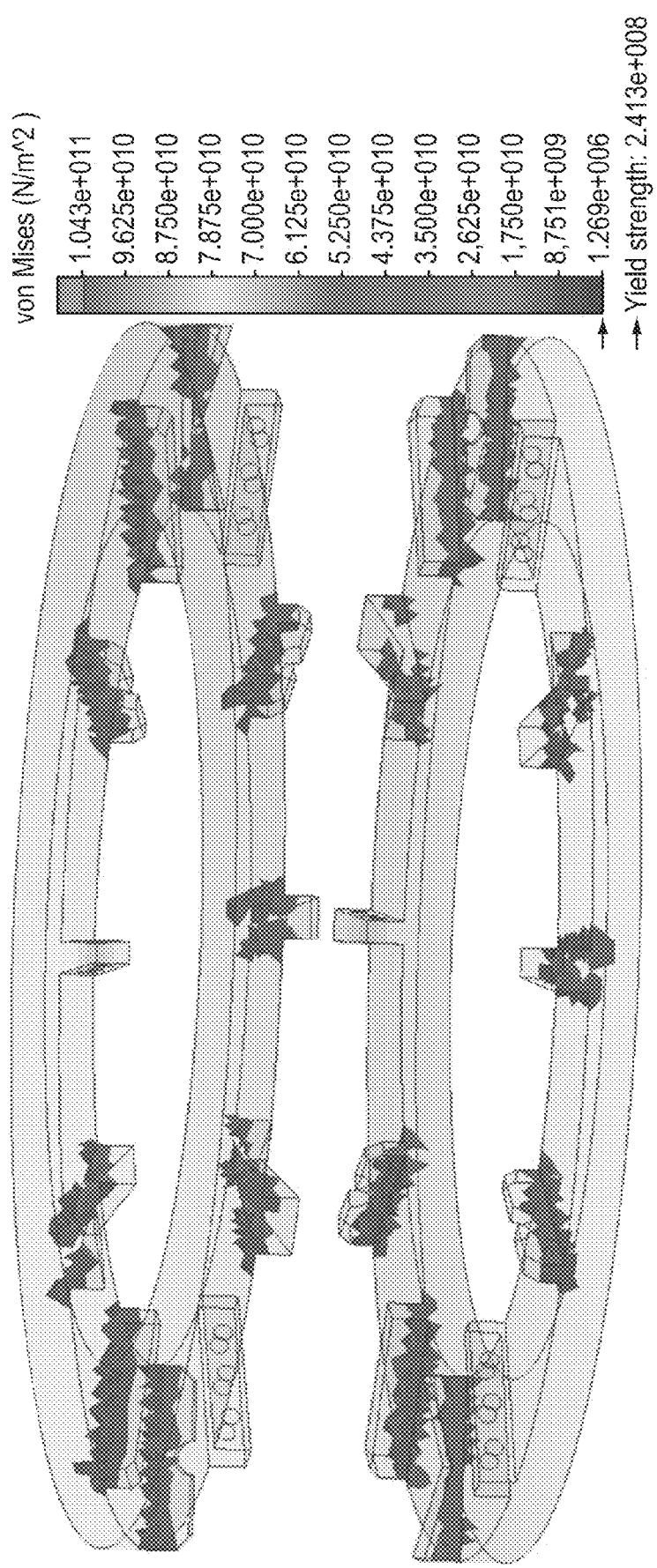
FIGS. 4a and 4b illustrate visualizations of results.
Figure 4B:
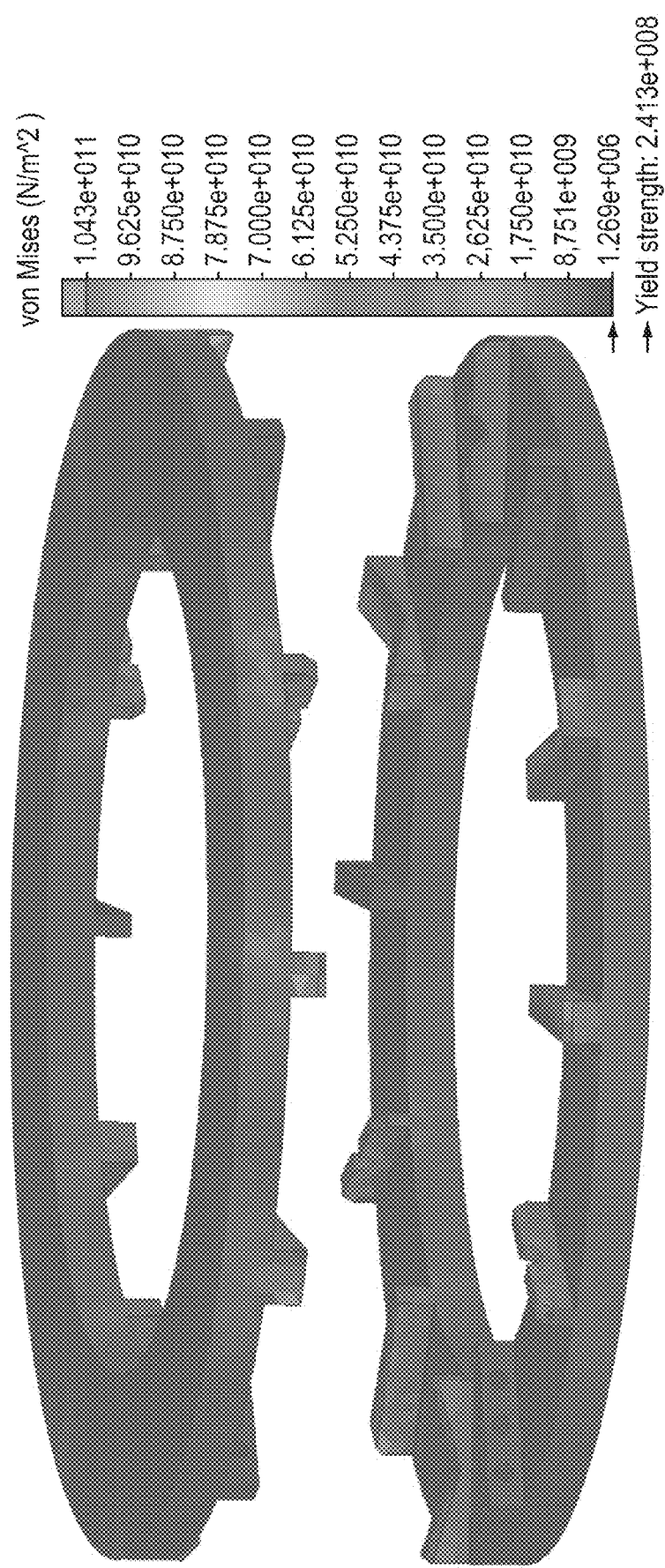

In the next step, visual feedback is given to the user to alert the user to the area of stress singularity (step 210). Visual feedback can take the form of showing the area of stress singularity in a contrasting color. (See FIGS. 4a and 4b, which visualize the results by isolating the values of singular elements or regions.) Visual feedback may also be given in the form of making the 3D model translucent except for the area of stress singularity, by way of non-limiting example. In an embodiment, when a user points to an area of stress singularity, a tool tip may appear, suggesting how the area should be modified to eliminate stress singularity.

Additionally, a table may be displayed in the user interface. The table may display a list of problematic edges and vertices, and suggestions on how the stress singularity may be eliminated in the area of the problematic edges. By way of non-limiting example, a suggestion may be to change geometry or change the load. A suggestion may be to fillet an edge with a radius of some degree or chamfer the edge.

In an embodiment, a check box appears beside each suggestion. If the user agrees with the suggestion, after selecting the checkbox and confirming that choice, the present invention automatically eliminates the stress singularity. This is possible because a finite element analysis process is integrated with a computer-aided design system. In this way, design iterations may easily include changes due to FEA results.

Referring now to FIG. 5a, an illustration of a table 500 in an embodiment of the present invention is shown. Rows in table 500 display a list of problematic edges and vertices detected as having stress singularity. The edges and vertices belong to three parts—Part1, Part2, Part3— in an assembly model. The edges and vertex listed in the column titled Region Detected 502 are the problematic entities of the respected region. Regions checked in the column titled Stress Concentration 504 are identified at the end of Step 204 in FIG. 2. The columns 506, 508 titled Refine 1 and Refine 2 contain data related to the iterations of refining a mesh, which was previously discussed with reference to FIG. 2, steps 202, 204, 206. The Refine 2 column 508 shows results of the last refinement, indicating that the regions checked in table 500, that is (i) Part2 Edge2/Load 1, (ii) Part3, Edge 1, and (iii) Part 3, Vertex 1 are regions of Stress Singularity in the assembly model detected by process 200. For visual feedback, the user may select a particular column, and in response, the corresponding regions in the 3D model are highlighted on the computer screen.

Referring now to FIG. 5b, an illustration of a user interface 510 in an embodiment of the present invention is shown. User interface 510 enables the user to assist in the elimination of stress singularity in the assembly model, which was indicated in table 500. The regions indicated in the Refine 2 column 512 correspond to the checked regions in the Refine 2 column 508 of FIG. 5a. The Select to Adjust column 514 allows the user to designate which regions the present invention shall automatically adjust. As shown, in FIG. 5b, two regions are selected—Part2 Edge2/Load 1 and Part3, Edge 1. User interface (UI) sliders in the third column 516 enable the user to adjust the radius of a fillet, which the present invention suggested adding to the design of the assembly model. The initial value of the fillet was also suggested by the present invention. The value of the UI slider is displayed in the fourth column 518. Additionally, the user may directly enter a value in the fourth column 518 to set the fillet radius. Selecting icons in the fifth and six columns of user interface 510 allows the user to set specific properties for the fillet and load for a specific region (e.g., corner fillet, tangent propagation, directional load). Finally, the user may select the Run button 520 to direct the present invention to make the changes to the 3D assembly model as specified in the user interface 510.

Figure 6:
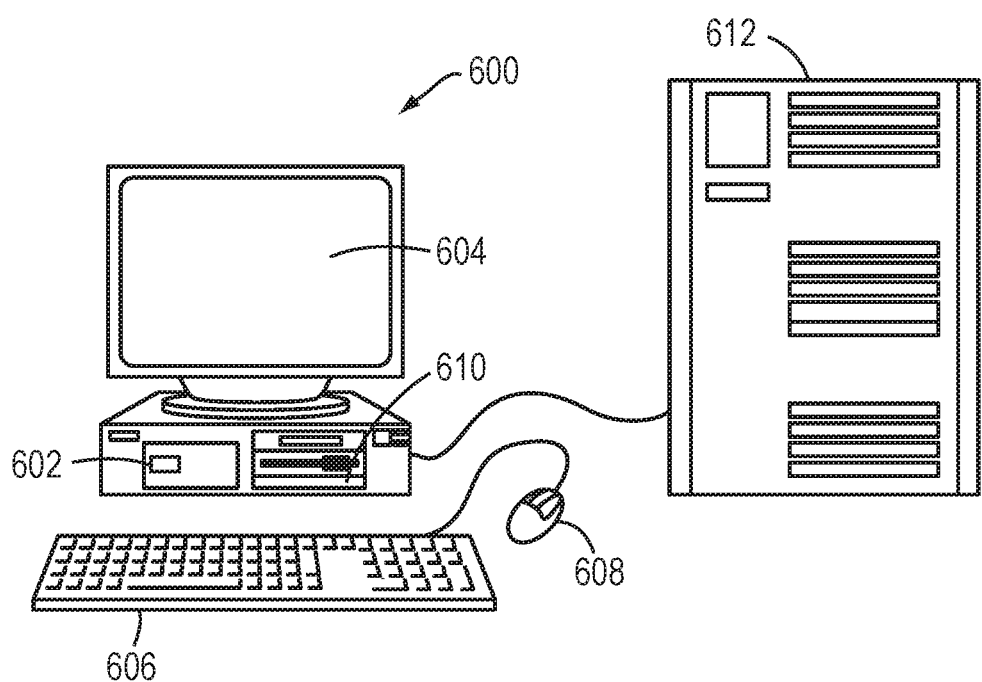
FIG. 6 is a schematic diagram of a computer system in which embodiments of the present invention may be implemented.

FIG. 6 illustrates a computerized modeling system 600 that includes a CPU 602, a computer monitor 604, a keyboard input device 606, a mouse input device 608, and a storage device 610. The CPU 602, computer monitor 604, keyboard 606, mouse 608, and storage device 610 can include commonly available computer hardware devices. For example, the CPU 602 can include an Intel-based processor. The mouse 608 may have conventional left and right buttons that the design engineer may press to issue a command to a software program being executed by the CPU 602. As an alternative or in addition to the mouse 608, the computerized modeling system 600 can include a pointing device such as a trackball, touch-sensitive pad, or pointing device and buttons built into the keyboard 606. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft Windows® 7 or Windows® 10, UNIX, Linux, or MAC OS operating systems.

Additional computer processing units and hardware devices (e.g., rapid prototyping, video, and printer devices) may be included in the computerized modeling system 600. Furthermore, the computerized modeling system 600 may include network hardware and software thereby enabling communication to a hardware platform 612, and facilitating communication between numerous computer systems that include a CPU and a storage system, among other computer components.

Computer-aided modeling software (e.g., process 200) may be stored on the storage device 610 and loaded into and executed by the CPU 602. The modeling software allows a design engineer to create and modify a 3D model and implements aspects of the invention described herein. The CPU 602 uses the computer monitor 604 to display a 3D model and other aspects thereof as described. Using the keyboard 606 and the mouse 608, the design engineer can enter and modify data associated with the 3D model. The CPU 602 accepts and processes input from the keyboard 606 and mouse 608. The CPU 602 processes the input along with the data associated with the 3D model and makes corresponding and appropriate changes to that which is displayed on the computer monitor 604 as commanded by the modeling software. In one embodiment, the modeling software is based on a solid modeling system that may be used to construct a 3D model consisting of one or more solid and surface bodies.

Embodiments of the invention may be implemented in digital electronic circuitry, or in computer hardware, firmware, software, or in combinations thereof. Apparatuses may be implemented in a computer program product tangibly embodied in a machine-readable storage device for execution by a programmable processor; and method steps may be performed by a programmable processor executing a program of instructions to perform functions by operating on input data and generating output. Embodiments of the invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory and in some embodiments instructions and data may be downloaded through a global network. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Embodiments of the present invention or aspects thereof described herein may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

The embodiments disclosed herein allow for automatic processes for detecting and eliminating stress singularity. Manual processes often need a user to have an advanced or expert level of education and experiences. Moreover, manual processes can be very time consuming, tedious, and hard to keep track of due to trouble with geometric entities, a group of elements, and/or various numerical results in multiple refined mesh iterations, for example. Eventually, a user may give up.

Other advantages offered by the present invention include dealing with local regions and areas of interest; the common issues of high strain, stress concentration, and stress singularity are detected. Furthermore, simulation parameters are fine tuned. For example, in a first refinement of a mesh, the highest strain may be 100, so looking at the top 30% are values from 70 to 100; in a second refinement of the mesh, the highest strain value may be different even though there is convergence.

Importantly the present invention is an education tool that guides a user through the detection and elimination of stress singularity. The user is aided in overcoming material, mesh, and stress concentration difficulties in a model of a product for manufacture.

A number of embodiments of the present invention have been described. Nevertheless, it will be understood that various modifications may be made without departing from the scope of the invention. For example, embodiments of the present invention may change the order in which operations are performed. Furthermore, depending on the needs of an implementation, particular operations described herein may be implemented as a combined operation, eliminated, added to, or otherwise rearranged.

What is claimed is:

1. A computer-implemented method for automatically detecting stress singularity in a three-dimensional (3D) computer-aided design (CAD) model, the method comprising:

detecting a potential area of high stress in which an element having a high stress value in the potential area has surrounding elements with a rapid stress value change, the high stress value and the rapid stress value change caused by simulating the 3D CAD model under load, wherein the element is a given finite element of a finite element mesh of the 3D CAD model, wherein the surrounding elements are surrounding finite elements that surround the given finite element in the finite element mesh, and wherein the detecting is based on stress values computed for the given and surrounding finite elements;

refining the finite element mesh of the 3D CAD model in at least the potential area of high stress;
determining whether the refining caused the high stress value to converge; and
in response to determining that the refining did not cause the high stress value to converge, (i) alerting a user that the potential area of high stress is an area identified as having one or more elements of stress singularity, (ii) providing at least one suggestion to the user via a user interface, the at least one suggestion suggesting to the user how to eliminate the stress singularity in the area identified in the finite element mesh of the 3D CAD model, and (iii) modifying the 3D CAD model based on input received from the user via the user interface, the modifying causing the stress singularity to be eliminated.

2. The computer-implemented method of claim 1, wherein the detecting includes narrowing an analysis for stress singularity of a plurality of finite elements of the finite element mesh to those finite elements having higher strain values, relative to respective strain values of other finite elements of the plurality of finite elements.

3. The computer-implemented method of claim 1, wherein the detecting includes analyzing a local area of a part in the 3D CAD model.

4. The computer-implemented method of claim 1, further comprising analyzing the 3D CAD model to locate geometry forming sharp angles.

5. The computer-implemented method of claim 1, wherein alerting the user includes visually indicating the area identified as having the one or more elements of stress singularity.

6. The computer-implemented method of claim 1, wherein the at least one suggestion includes a suggestion of any one or combination of: removing sharp angled geometry from the 3D CAD model, creating a new geometric entity to add to the 3D CAD model, and changing a load imposed on at least a portion of the 3D CAD model.

7. The computer-implemented method of claim 1, wherein the at least one suggestion takes a form of any one or combination of: a tool tip and a table.

8. The computer-implemented method of claim 1, further comprising:
integrating a finite element analysis process and a computer-aided design (CAD) system, wherein the 3D CAD model is an underlying 3D CAD model of the CAD system; and
automatically changing the underlying 3D CAD model upon the user choosing a suggestion of the at least one suggestion provided for how to eliminate the stress singularity.

9. A computer-aided design system comprising:
a processor operatively coupled to a data storage system, the data storage system storing a three-dimensional (3D) computer-aided design (CAD) model; and
a data storage memory operatively coupled to the processor and having instructions executed by the processor to:
detect a potential area of high stress in which an element having a high stress value in the potential area has surrounding elements with a rapid change in stress gradient, the high stress value and the rapid stress value change caused during simulation, by the processor, of the 3D CAD model under load, wherein the element is a given finite element of a finite element mesh of the 3D CAD model, wherein the surrounding elements are surrounding finite elements that surround the given finite element in the finite element mesh, and wherein the potential area of high stress is detected based on stress values computed for the given and surrounding finite elements;
refine the finite element mesh of the 3D CAD model in at least the potential area of high stress;
determine whether refining the finite element mesh caused the high stress value to converge; and
in response to determining that refining the 3D CAD model did not cause the high stress value to converge, (i) alert a user that the potential area of high stress is an area identified as having one or more elements of stress singularity, (ii) provide at least one suggestion to the user via a user interface, the at least one suggestion suggesting to the user how to eliminate the stress singularity in the area identified in the finite element mesh of the 3D CAD model, and (iii) modify the 3D CAD model based on input received from the user via the user interface, modification of the 3D CAD model causing the stress singularity to be eliminated.

10. The computer-aided design system of claim 9, wherein the instructions further cause the processor to detect the potential area of high stress by narrowing an analysis for stress singularity of a plurality of finite elements of the finite element mesh to those finite elements having higher strain values, relative to respective strain values of other finite elements of the plurality of finite elements.

11. The computer-aided design system of claim 9, wherein the instructions further cause the processor to detect the potential area of high stress by analyzing a local area of a part in the 3D CAD model.

12. The computer-aided design system of claim 9, wherein the instructions further cause the processor to detect the potential area of high stress by analyzing the 3D model to locate geometry forming sharp angles.

13. The computer-aided design system of claim 9, wherein the instructions further cause the processor to visually indicate the potential area of high stress.

14. The computer-aided design system of claim 9, wherein the instructions further cause the processor to propose to the user any one or combination of: removing sharp angled geometry from the 3D CAD model, creating a new geometric entity to add to the 3D CAD model, and changing a load imposed on at least a portion of the 3D CAD model, to eliminate the stress singularity.

15. The computer-aided design system of claim 14, wherein one or both of a tool tip and a table propose how to eliminate the stress singularity.

16. The computer-aided design system of claim 9, wherein the instructions further cause the processor to:
integrate a finite element analysis process and a computer-aided design process; and
change the 3D CAD model automatically upon the user choosing a suggestion of the at least one suggestion provided for how to eliminate the stress singularity.

17. A non-transitory computer-readable data storage medium, the non-transitory computer-readable medium having encoded thereon a sequence of instructions, which, when executed by a computer, causes the computer to:
detect a potential area of high stress in which an element having a high stress value in the potential area has surrounding elements with a rapid change of stress gradient, the high stress value and the rapid stress value change cause by simulation, by the computer, of the 3D CAD model under load, wherein the element is a given finite element of a finite element mesh of the 3D CAD model, wherein the surrounding elements are surrounding finite elements that surround the given finite element in the finite element mesh, and wherein the potential area of high stress is detected based on stress values computed for the given and surrounding finite elements;

refine the finite element mesh of the 3D CAD model in at least the potential area of high stress;

determine whether refining the finite element mesh caused the high stress value to converge; and in response to determining that refining the 3D CAD model did not cause the high stress value to converge, (i) alert a user that the potential area of high stress is an area identified as having one or more elements of stress singularity (ii) provide at least one suggestion to the user via a user interface, the at least one suggestion suggesting to the user how to eliminate the stress singularity in the area identified in the finite element mesh of the 3D CAD model, and (iii) modify the 3D CAD model based on input received from the user via the user interface, modification of the 3D CAD model causing the stress singularity to be eliminated.

18. The computer-readable data storage medium of claim 17, wherein the sequence of instructions further causes the computer to:

integrate a finite element analysis process and a computer-aided design process; and change the 3D CAD model automatically upon the user choosing a suggestion of the at least one suggestion provided for how to eliminate the stress singularity.

19. The computer-readable data storage medium of claim 17, wherein the sequence of instructions further causes the computer to detect the potential area of high stress by narrowing an analysis for stress singularity of a plurality of finite elements of the finite element mesh to those finite elements having higher strain values, relative to respective strain values of other finite elements of the plurality of finite elements.

20. The computer-readable data storage medium of claim 17, wherein the sequence of instructions further causes the computer to detect the potential area of high stress by analyzing a local area of a part in the 3D CAD model.

21. The computer-readable data storage medium of claim 17, wherein the sequence of instructions further causes the computer to analyze the 3D model to locate geometry forming sharp angles to detect the potential area of high stress.

22. The computer-readable data storage medium of claim 17, wherein the sequence of instructions further causes the computer to visually indicate the potential area of high stress.

23. The computer-readable data storage medium of claim 17, wherein the sequence of instructions further causes the computer to suggest to the user any one or combination of: removing sharp angled geometry from the 3D CAD model, creating a new geometric entity to add to the 3D CAD model, and changing a load imposed on at least a portion of the 3D CAD model, to eliminate stress singularity.

24. The computer-readable data storage medium of claim 17, wherein one or both of a tool tip and a table suggest how to eliminate the stress singularity.

* * * * *